United States Patent
Sarkozy et al.

(10) Patent No.: US 9,882,000 B2
(45) Date of Patent: Jan. 30, 2018

(54) WRAP AROUND GATE FIELD EFFECT TRANSISTOR (WAGFET)

(71) Applicant: NORTHROP GRUMMAN SYSTEMS CORPORATION, Falls Church, VA (US)

(72) Inventors: Stephen J. Sarkozy, Redondo Beach, CA (US); Yaochung Chen, Rancho Palos Verdes, CA (US); Richard Lai, Redondo Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/163,375

(22) Filed: May 24, 2016

(65) Prior Publication Data

US 2017/0345895 A1   Nov. 30, 2017

(51) Int. Cl.
| | | |
|---|---|---|
| *H01L 29/49* | (2006.01) | |
| *H01L 29/06* | (2006.01) | |
| *H01L 29/22* | (2006.01) | |
| *H01L 29/423* | (2006.01) | |
| *H01L 29/40* | (2006.01) | |
| *H01L 29/66* | (2006.01) | |

(52) U.S. Cl.
CPC ......... *H01L 29/0665* (2013.01); *H01L 29/22* (2013.01); *H01L 29/401* (2013.01); *H01L 29/42356* (2013.01); *H01L 29/66522* (2013.01)

(58) Field of Classification Search
CPC ... H01L 29/0665; H01L 29/22; H01L 29/401; H01L 29/42356; H01L 29/66522
See application file for complete search history.

(56) References Cited

U.S. PATENT DOCUMENTS

| | | |
|---|---|---|
| 6,888,181 B1 | 5/2005 | Liao et al. |
| 7,074,623 B2 | 7/2006 | Lochtefeld et al. |
| 7,122,412 B2 | 10/2006 | Chen et al. |
| 7,432,139 B2 | 10/2008 | Currie |
| 7,456,476 B2 | 11/2008 | Hareland et al. |
| 7,714,384 B2 | 5/2010 | Seliskar |
| 7,859,044 B2 | 12/2010 | Wong et al. |

(Continued)

OTHER PUBLICATIONS

Xue, Fei et al. "Nonplanar InGaAs Gate Wrapped Around Field-Effect Transistors" IEEE Transactions on Electron Devices vol. 61, No. 7, Jul. 2014, pp. 2332-2337.

(Continued)

*Primary Examiner* — Michael Shingleton
(74) *Attorney, Agent, or Firm* — John A. Miller; Miller IP Group, PLC

(57) ABSTRACT

A field effect transistor (FET) including a substrate, a plurality of semiconductor epitaxial layers deposited on the substrate, and a heavily doped gate layer deposited on the semiconductor layers. The FET also includes a plurality of castellation structures formed on the heavily doped gate layer and being spaced apart from each other, where each castellation structure includes at least one channel layer. A gate metal is deposited on the castellation structures and between the castellation structures to be in direct electrical contact with the heavily doped gate layer. A voltage potential applied to the gate metal structure modulates the at least one channel layer in each castellation structure from an upper, lower and side direction.

20 Claims, 1 Drawing Sheet

(56) References Cited

U.S. PATENT DOCUMENTS

| | | | |
|---|---|---|---|
| 8,183,627 B2 | 5/2012 | Currie | |
| 8,394,684 B2 | 3/2013 | Kanakasabapathy et al. | |
| 8,445,963 B2 | 5/2013 | Jakschik et al. | |
| 8,497,177 B1 | 7/2013 | Chang et al. | |
| 8,614,434 B2 | 12/2013 | Bangsaruntip et al. | |
| 8,629,512 B2 | 1/2014 | Liaw | |
| 8,823,060 B1 | 9/2014 | Colinge et al. | |
| 8,847,324 B2 | 9/2014 | Choi et al. | |
| 2008/0050897 A1 | 2/2008 | Kottantharayil | |
| 2008/0206937 A1 | 8/2008 | Furukawa et al. | |
| 2012/0280208 A1 | 11/2012 | Jain | |
| 2012/0305893 A1* | 12/2012 | Colinge | B82Y 10/00 257/29 |
| 2015/0123215 A1 | 5/2015 | Obradovic et al. | |
| 2016/0049504 A1 | 2/2016 | Renaldo et al. | |
| 2017/0003248 A1* | 1/2017 | Yang | G01N 27/4141 |
| 2017/0221893 A1* | 8/2017 | Tak | H01L 27/0886 257/401 |

OTHER PUBLICATIONS

Xue, Fei, "Excellent Device Performance of 3D In0.53Ga0.47As Gate Wrap-Around Field-Effect-Transistors with High-k Gate Dielectrics" Electron Devices Meeting (IEDM) IEEE International, 2012, pp. 27.5.1-27.5.4.

Hisamoto, Digh, "FinFET—A Self-Aligned Double-Gate MOSFET Scalable to 20 nm" Electron Devices IEEE Transactions on 47.12, 2000, pp. 2320-2325.

* cited by examiner

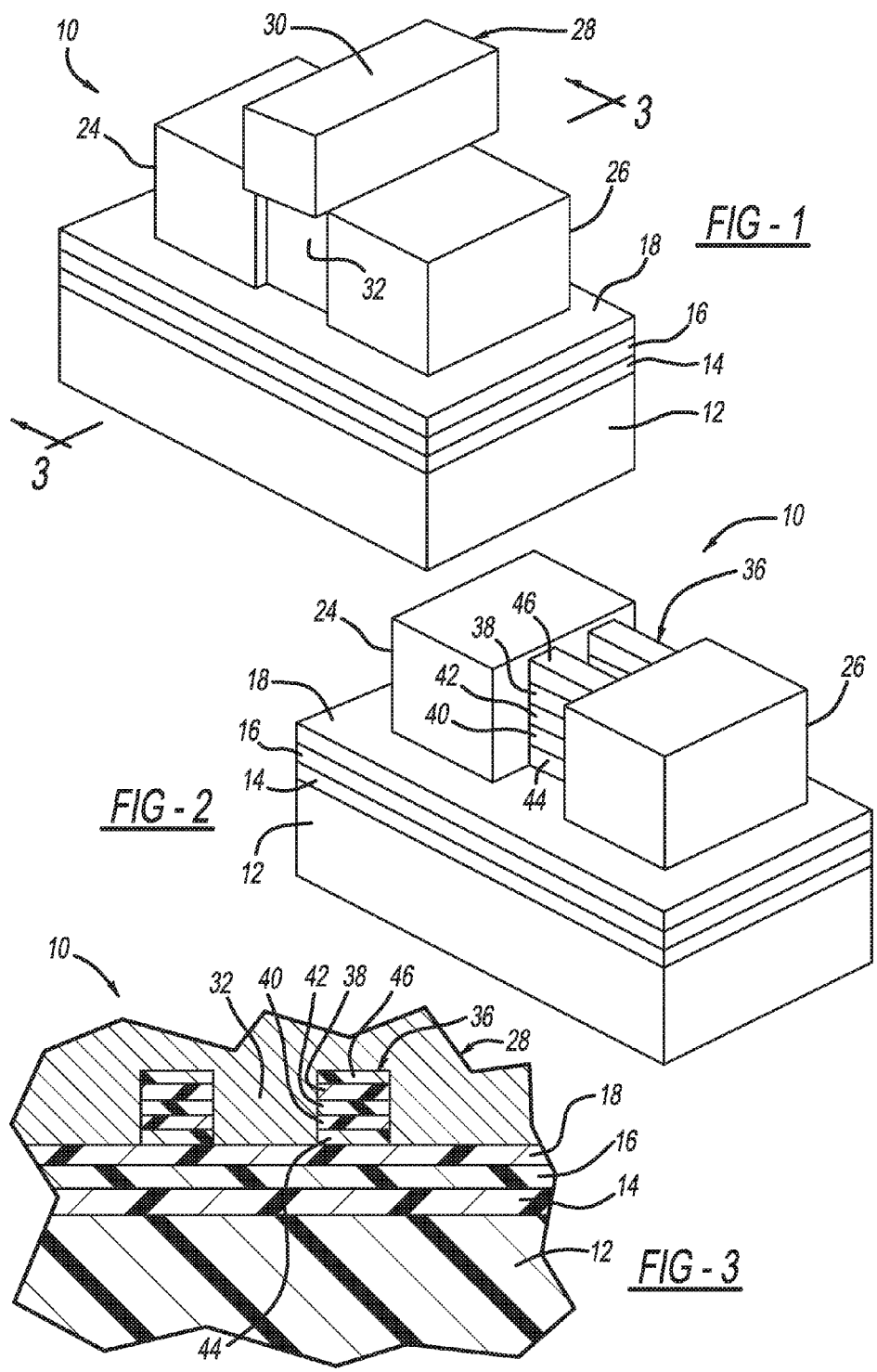

US 9,882,000 B2

WRAP AROUND GATE FIELD EFFECT TRANSISTOR (WAGFET)

BACKGROUND

Field

This invention relates generally to a wrap around gate field effect transistor (WAGFET) and, more particularly, to a WAGFET that includes a plurality of three-dimensional castellation structures each having one or more channels layers deposited on a heavily doped layer, where gate metal is deposited on the castellation structures and between the castellation structures to be in direct electrical contact with the heavily doped gate layer so as to modulate the channel layer from all directions.

Discussion

Field-effect transistors (FET) are well known in the transistor art, and come in a variety of well known types, such a HEMT, MOSFET, MISFET, FinFET, etc., and can be integrated as horizontal devices or vertical devices. A typical FET will include various semiconductor layers, such as silicon, gallium arsenide (GaAs), indium gallium arsenide (InGaAs), gallium nitride (GaN), indium phosphide (InP), etc. Sometimes the semiconductor layers are doped with various impurities, such as boron, to increase the population of carriers in the layer, where the higher the doping level of the layer the greater the conductivity of the particular semiconductor material. An FET will also include a source terminal, a drain terminal and a gate terminal, where one or more of the semiconductor layers is designated a channel layer and is in a electrical contact with the source and drain terminals. An electrical potential provided to the source terminal allows electrical carriers, either N-type or P-type, to flow through the channel layer to the drain terminal. An electric signal applied to the gate terminal creates an electrical field that modulates the carriers in the channel layer, where a small change in the gate voltage can cause a large variation in the population of carriers in the channel layer to change the current flow from the source terminal to the drain terminal.

It is known in the art to provide an FET that includes spaced apart castellation structures including one or more channel layers all deposited on a common base structure. In these types of castellated FETs, a common gate metal is deposited on the base structure so that it encloses all of the castellation structures, particularly tops of the castellation structures and sides of the castellation structures. In this type of configuration, the electric field generated by the gate terminal to modulate the channel layer or layers is applied to not only the top of the channel layer, but also to the sides of the channel layer, which improves the amplification of the current flow.

BRIEF DESCRIPTION OF THE DRAWINGS

FIG. 1 is an isometric view of a wrap-around field effect transistor (WAGNET);

FIG. 2 is an isometric view of the WAGFET shown in FIG. 1 with a gate terminal removed; and FIG. 3 is a cut-away, cross-sectional profile view of the WAGFET shown in FIG. 1 through line 3-3.

DETAILED DESCRIPTION OF THE EMBODIMENTS

The following discussion of the embodiments of the invention is directed to a WAGFET including a plurality of castellation structures and a heavily doped gate layer, where gate metal is deposited on the castellation structures and between the castellation structures to be in direct electrical contact with the heavily doped gate layer so as to modulate the channel layer from all directions, where the discussion is merely exemplary in nature, and is in no way intended to limit the invention or its applications or uses.

FIG. 1 is an isometric view of a WAGFET 10 that provides modulation of one or more channel layers as will be described in detail below. The WAGFET 10 includes a substrate 12 that is made of any suitable material, for example, SiC, Sapphire, GaN, AlN, Si, GaAs, etc. In this non-limiting example, the substrate 12 is a GaAs substrate. A number of semiconductor layers are then grown on the substrate 12 as epitaxial layers to a desired layer thickness for the particular FET design. For example, in this non-limiting embodiment, a buffer layer 14 is grown on the substrate 12 and an InGaAs barrier layer 16 is grown on the buffer layer 14. A heavily doped gate layer 18 is grown on the barrier layer 16, and is a pseudo-conductive layer that provides a modulation signal to a channel layer, as will be described in detail below. The gate layer 18 can be any suitable semiconductor material, such as GaAs in this non-limiting example, having any suitable thickness, and being doped with any suitable impurity or dopant that provides a high number of N-type or P-type carriers. Suitable and well known patterning and metal deposition steps are employed to deposit a source terminal 24, a drain terminal 26 and a gate terminal 28 on the gate layer 18, where the gate terminal 28 includes a top portion 30 and side portions 32 for reasons that will become apparent from the discussion below. The gate terminal 28 is not in electrical contact with the source terminal 24 and the drain terminal 26. Furthermore, regions of the gate layer 18 and the barrier layer 16 beneath the source terminal 24 and the drain terminal 26 are removed so that the source and drain terminals 24 and 26 are deposited on the undoped buffer layer 14 and isolated from the gate layer 18.

FIG. 2 is an isometric view of the WAGFET 10 with the gate terminal 28 removed showing a plurality of gate castellation structures 36. FIG. 3 is a cut-away cross-sectional view of the WAGFET 10 through line 3-3 of FIG. 1. In this embodiment, the WAGFET 10 includes two of the castellation structures 36. However, as would be well understood by those skilled in the art, such a castellated FET of the type described herein would include many of the castellation structures 36 forming a castellated gate. Each castellation structure 36 includes two channel layers, namely, an upper channel layer 38 and a lower channel layer 40, separated by a semiconductor spacer layer 42, where the channel layers 38 and 40 may be quantum well structures, for example, alternating layers of GaAs and AlAs. Although the castellation structures 36 include the two channel layers 38 and 40, this is by way of a non-limiting example in that the castellated structures 36 may only employ a single channel layer, or more than two channel layers. Further, a second semiconductor spacer layer 44 is provided between the lower channel layer 40 and the gate layer 18. A semiconductor cap layer 46 is grown on the upper channel layer 38 and insulates the upper channel layer 38 from the gate terminal 28. The spacer layers 42 and 44 and the cap layer 46 can be made of any suitable semiconductor material and have any suitable thickness for the purposes described herein. The side portion 32 of the gate terminal 28 encloses sides of the castellation structures 36 and is not in electrical contact with the channel layers 38 and 40.

As is apparent, in this configuration, the gate terminal 28 is formed on top of each of the castellation structures 36 and around the sides of each of the castellation structures 36 so that a voltage potential from the gate terminal 28 is provided to sides and the top of the channel layers 38 and 40. Further, the gate terminal 28 is in electrical contact with the gate layer 18 so that the gate layer 18 is at the same potential as the terminal 28, which causes a current flow therethrough that generates an electric field applied to a bottom of the channel layers 38 and 40. The field effect from the upper, lateral and lower surfaces of the castellation structures 36 provides a more uniform channel flow in each of the channel layers 36 and 40 in each of the castellation structures 36. In other words, applying a modulation signal to all sides of the channel layers 38 and 40, provides a more uniform modulation of the electric field, which allows the WAGFET 10 to operate with higher linearity to amplify signals with different strengths. The modulating signals from the gate terminal 28 and the heavily doped gate layer 18 operate to populate the channel layers 38 and 40 in a uniform manner so that the performance of the channel layers 38 and 40 is improved. In this manner, the gate layer 18 can be grown on the base layers in the same manner as the castellation structures 36, where the gate terminal 28 is then deposited on top of the castellation structures 36, and where the gate layer 18 will ultimately act as a suitable conductor.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A semiconductor device comprising:
   a substrate;
   a plurality of semiconductor layers deposited on the substrate;
   a heavily doped gate layer deposited on the semiconductor layers;
   a plurality of castellation structures formed on the heavily doped layer and being spaced apart from each other, each castellation structure including at least one channel layer; and
   a gate metal structure formed over the plurality of castellation structures so that gate metal is deposited on the castellation structures and between the castellation structures to be in direct electrical contact with the heavily doped gate layer, wherein a voltage potential applied to the gate metal structure modulates the at least one channel layer in each castellation structure from an upper, lower and side direction.

2. The semiconductor device according to claim 1 wherein each castellation structure includes two channel layers separated by a spacer layer.

3. The semiconductor device according to claim 1 wherein each castellation structure includes a spacer layer between the at least one channel layer and the heavily doped layer.

4. The semiconductor device according to claim 1 wherein each castellation structure includes a cap layer on top of the at least one channel layer.

5. The semiconductor device according to claim 1 wherein the heavily doped layer is a heavily doped N-type GaAs layer.

6. The semiconductor device according to claim 1 wherein the at least one channel layer in each castellation structure is a quantum well structure.

7. The semiconductor device according to claim 1 wherein the substrate is a GaAs substrate.

8. The semiconductor device according to claim 1 wherein the semiconductor device is a field effect transistor.

9. A field effect transistor (FET) comprising:
   a substrate;
   a plurality of semiconductor layers deposited on the substrate;
   a heavily doped gate layer deposited on the semiconductor layers;
   a plurality of castellation structures formed on the heavily doped layer and being spaced apart from each other, each castellation structure including an upper channel layer, a lower channel layer, a first spacer layer positioned between the upper and lower channel layers, a second spacer layer positioned between the lower channel layer and the heavily doped gate layer, and a cap layer positioned on top of the upper channel layer; and
   a gate metal structure formed over the plurality of castellation structures so that gate metal is deposited on the castellation structures and between the castellation structures to be in direct electrical contact with the heavily doped gate layer, wherein a voltage potential applied to the gate metal structure modulates the channel layers in each castellation structure from an upper, lower and side direction.

10. The FET according to claim 9 wherein the heavily doped layer is a heavily doped N-type GaAs layer.

11. The FET according to claim 9 wherein the at least one channel layer in each castellation structure is a quantum well structure.

12. The FET according to claim 9 wherein the substrate is a GaAs substrate.

13. A method for fabricating a semiconductor device comprising:
    providing a substrate;
    epitaxially growing a plurality of semiconductor layers deposited on the substrate;
    epitaxially growing a heavily doped gate layer on the semiconductor layers;
    forming a plurality of castellation structures on the heavily doped layer and being spaced apart from each other, where each castellation structure includes at least one channel layer; and
    forming a gate metal structure over the plurality of castellation structures so that gate metal is deposited on the castellation structures and between the castellation structures to be in direct electrical contact with the heavily doped gate layer, wherein a voltage potential applied to the gate metal structure modulates the at least one channel layer in each castellation structure from an upper, lower and side direction.

14. The method according to claim 13 wherein forming a plurality of castellation structures includes forming castellation structures including two channel layers separated by a spacer layer.

15. The method according to claim 13 wherein forming a plurality of castellation structures includes forming castellation structures including a spacer layer between the at least one channel layer and the heavily doped layer.

16. The method according to claim 13 wherein forming a plurality of castellation structures includes forming castellation structures including a cap layer on top of the at least one channel layer.

17. The method according to claim 13 wherein the heavily doped layer is a heavily doped N-type GaAs layer.

18. The method according to claim 13 wherein forming a plurality of castellation structures includes forming castellation structures where the at least one channel layer is a quantum well structure.

19. The method according to claim 13 wherein providing a substrate substrate includes providing a GaAs substrate.

20. The method according to claim 13 wherein the semiconductor device is a field effect transistor.

\* \* \* \* \*